(12) United States Patent
Huang et al.

(10) Patent No.: US 8,332,551 B2
(45) Date of Patent: Dec. 11, 2012

(54) COMPRESSED DATA MANAGING SYSTEM AND METHOD FOR CIRCULAR BUFFER

(75) Inventors: Ing-Jer Huang, Kaohsiung (TW); Fu-Ching Yang, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 227 days.

(21) Appl. No.: 12/844,249

(22) Filed: Jul. 27, 2010

(65) Prior Publication Data

US 2011/0023052 A1   Jan. 27, 2011

(30) Foreign Application Priority Data

Jul. 27, 2009   (TW) ................................ 98125254 A

(51) Int. Cl.
G06F 3/00 (2006.01)
G06F 5/00 (2006.01)
(52) U.S. Cl. ............................................. 710/52; 710/3
(58) Field of Classification Search ................ 710/52, 710/3
See application file for complete search history.

(56) References Cited

U.S. PATENT DOCUMENTS

| | | | | |
|---|---|---|---|---|
| 5,105,424 A * | 4/1992 | Flaig et al. | ..................... | 709/243 |
| 6,195,024 B1 | 2/2001 | Fallon | | |
| 6,243,836 B1 * | 6/2001 | Whalen | ........................... | 714/45 |
| 7,979,403 B2 | 7/2011 | Kedem et al. | | |
| 2004/0103399 A1* | 5/2004 | Agarwala et al. | .............. | 717/128 |
| 2004/0158776 A1* | 8/2004 | McCullough et al. | ........... | 714/45 |
| 2007/0101198 A1* | 5/2007 | Ueno | .............................. | 714/38 |

FOREIGN PATENT DOCUMENTS

CN    1973287 A    5/2007

OTHER PUBLICATIONS

Office Action of corresponding China application 200910209429.0 issued Dec. 31, 2011 cites CN 1973287A and US 6195024B1.
Office Action of corresponding China application 200910209429.0 issued May 18, 2012.
CN 1973287A is the corresponding application to US Patent No. 7,979,403 B2 issued Jul. 12, 2011.
English Abstracts of First and Second Office Actions of Chinese application No. 200910209429.0.

* cited by examiner

*Primary Examiner* — Chun-Kuan Lee
*Assistant Examiner* — Farley Abad
(74) *Attorney, Agent, or Firm* — WPAT, P.C.; Anthony King

(57) ABSTRACT

The invention relates to a compressed data managing system and method for circular buffer. By using the system and method of the invention, when storing the compressed data in a circular buffer and an event occurs, the hardware compression mechanism can stop immediately, without jeopardizing the decompression of the compressed data. Therefore, the system and method of the invention can overcome the following conventional problem: Conventional real-time tracers need several cycles to write the compressed data into the trace memory, which is unbeneficial to error diagnosis. Since when an error occurs, the system might enter the unstable state, this could cause that the tracers fail to write the last compressed data into the trace memory.

8 Claims, 4 Drawing Sheets

COMPRESSED DATA MANAGING SYSTEM AND METHOD FOR CIRCULAR BUFFER

BACKGROUND OF THE INVENTION

1. Field of the Invention

The presented invention relates to a compressed data managing system and method, and more particularly to a compressed data managing system and method for circular buffer.

2. Description of the Related Art

A complicated system-on-chip (SoC), as shown in FIG. 1, includes active devices such as a microprocessor 10, a digital signal processor 11, and a direct memory accessor 14, and passive devices such as a hardware accelerator 15, an on-chip memory 12, and an external output interface 13. These devices are connected with an on-chip bus 18 to communicate with each other.

Since the on-chip operations are complicated, it is important to observe the chip's internal operations in order to debug and analyze the chip performance. The most intuitive approach would be to connect interested signals to the chip output pins. However, since a large number of signals need to be observed and chip pins are limited, this approach is generally impractical.

In view of the above, a commonly used method is to place a real-time tracer 16 in a chip to capture signals in real time and store the captured signals in the limited spaced on-chip trace memory 17. After a tracing finishes, a decompression process is performed by the external software in an off-line manner to recover the signals. As the memory space is limited, in a related conventional method a compression function is added to the real-time tracer to increase the volume of traced information in the limited space.

In U.S. Patent Publication No. 2004/0103399 and No. 2007/0094645, program addresses of a microprocessor are compressed. Specifically, a complete address is first recorded, and then only the difference between subsequent data and the complete data need to be recorded. Furthermore, in U.S. Patent Publication No. 2006/0212761 and No. 2003/0126358, a memory is used for compression. Specifically, if the input data is not found in the memory, complete input data needs to be recorded and input to memory; and if the input data is found in memory, only a serial number of the data in the memory needs to be recorded to achieve compression.

The real-time tracer is used to trace the signal before the error occurs. However, when the error occurs, the whole system is unstable. The conventional real-time tracers need several cycles to write the compressed data into the trace memory, which is unbeneficial to error diagnosis. Since when an error occurs, the system might enter the unstable state, this could cause that the tracers fail to write the last compressed data into the trace memory.

Therefore, there is a need for a compressed data managing system and method for circular buffer to solve the above problems.

SUMMARY OF THE INVENTION

The present invention provides a compressed data managing system for circular buffer. The compressed data managing system of the invention comprises: a header generating device, an integrating device and an address generating device. The header generating device is used for receiving compressed data and identifying compressed data to generate corresponding header. The header generating device receives a stop signal. When the stop signal is enabled, the header generating device stops. The integrating device is used for receiving compressed data and corresponding header to pack compressed data and corresponding header as a package, and calculate a length of the package. The package is outputted to a circular buffer, and the integrating device receives the stop signal. When the stop signal is enabled, the integrating device stops. The address generating device is used for calculating the address of the package in the circular buffer according to the length of the package. The address generating device receives the stop signal. When the stop signal is enabled, the address generating device stops.

The present invention further provides a compressed data managing method for circular buffer, comprising: (a) identifying compressed data and generating corresponding header; (b) packing compressed data and corresponding header as a package according to compressed data and corresponding header, calculating the length of the package, wherein the package is outputted to a circular buffer; (c) calculating an address of the package in the circular buffer; and (d) stopping the above steps according to a stop signal and when the stop signal is enabled.

By using the system and method of the invention, when storing the compressed data in a circular buffer and an event occurs, the hardware compression mechanism can stop immediately, without jeopardizing the decompression of the compressed data. Furthermore, the problem that the tracers fail to write the last compressed data into the trace memory in the prior art can be solved.

DETAILED DESCRIPTION OF THE INVENTION

Figure 1:
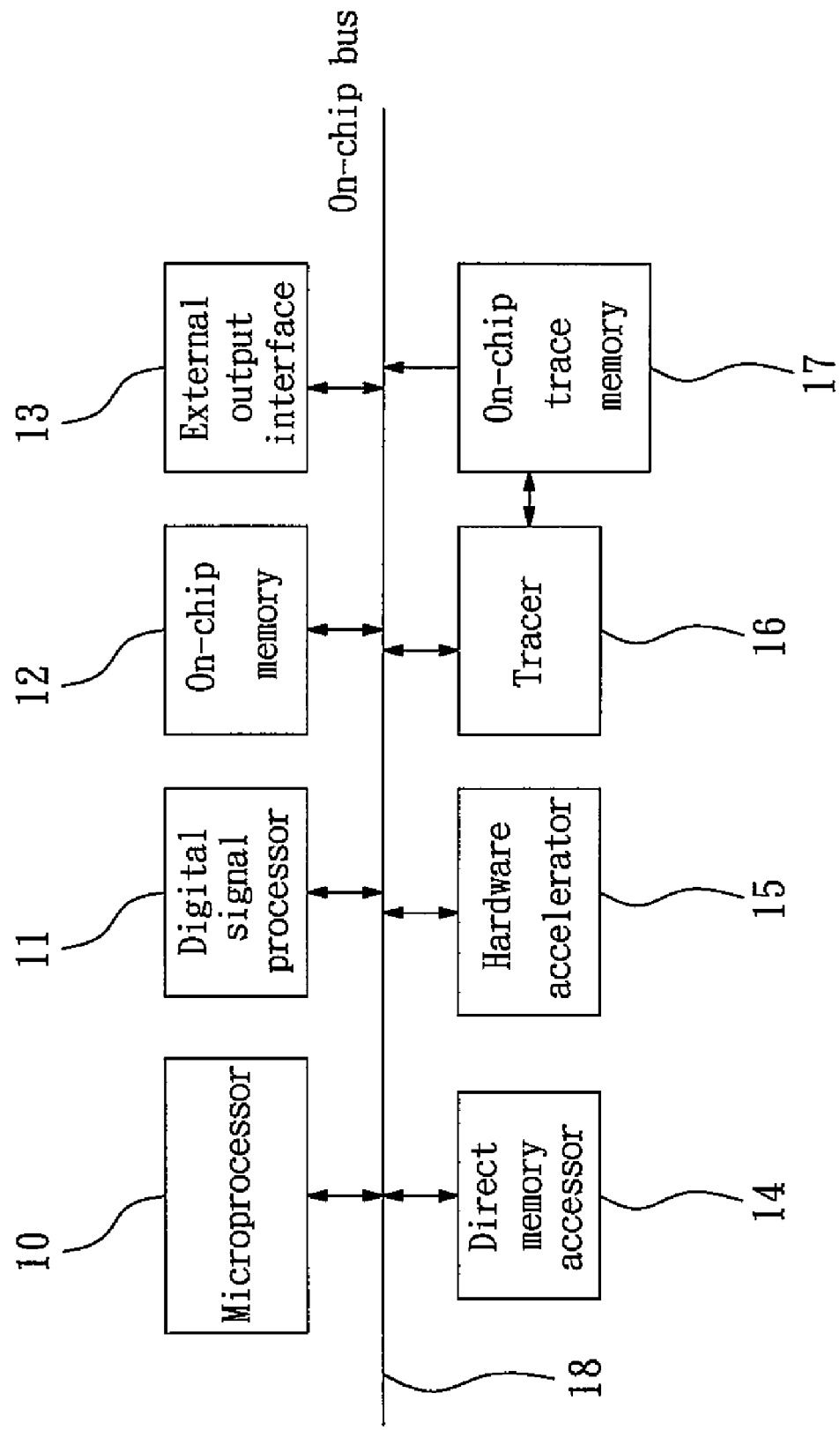
FIG. 1 is a schematic block diagram of a conventional SoC.
Figure 2:
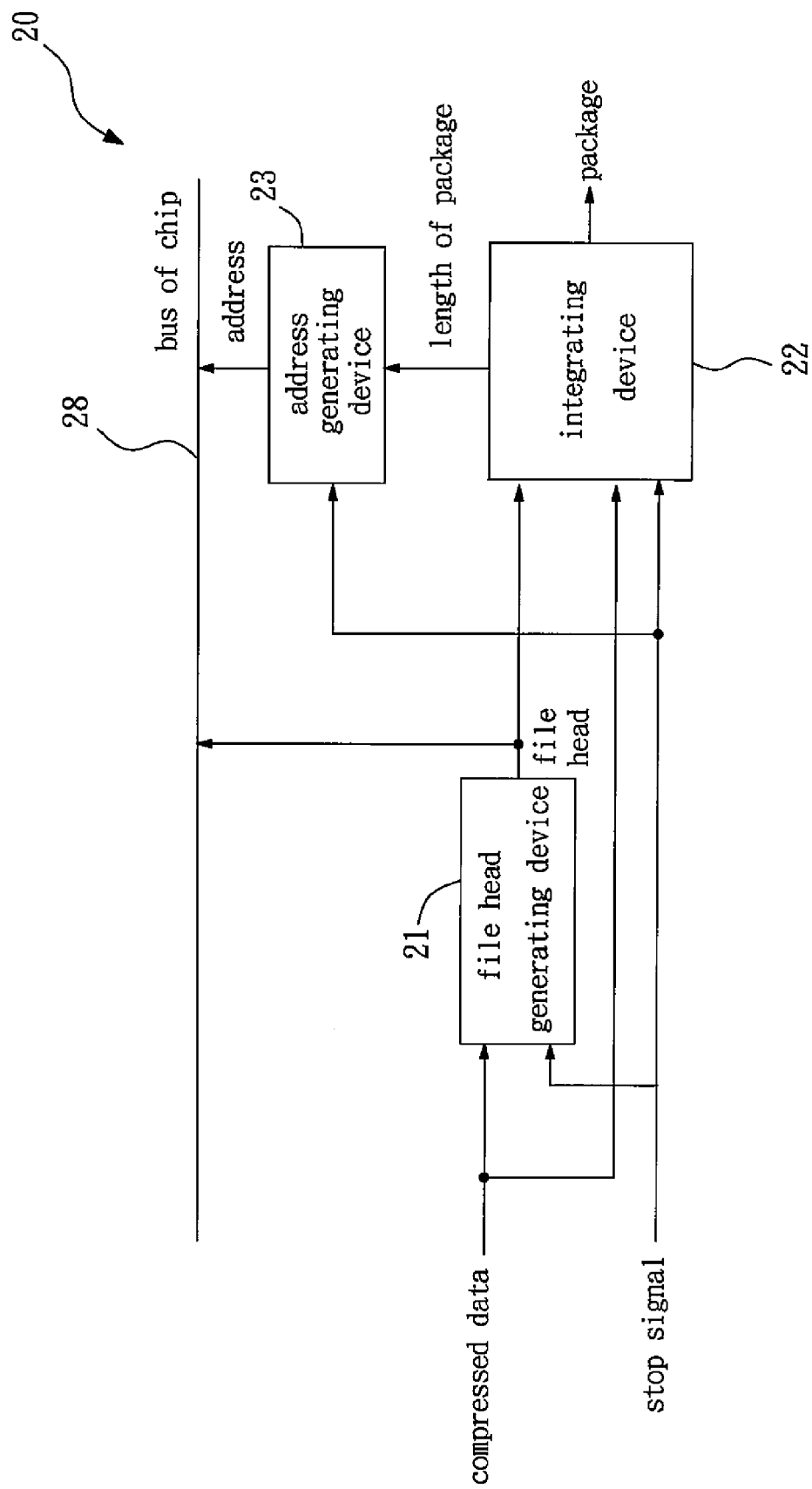
FIG. 2 is a schematic block diagram of a compressed data managing system for circular buffer according to the present invention.

Referring to FIG. 2, it shows a schematic block diagram of a compressed data managing system for circular buffer according to the present invention. The compressed data managing system 20 comprises: a header generating device 21, an integrating device 22 and an address generating device 23. The header generating device 21 is used for receiving compressed data and identifying compressed data to generate corresponding header. The header generating device 21 receives a stop signal. When the stop signal is enabled, the header generating device 21 stops. Preferably, the compressed data is backward compressed data, however, the compressed data don't limit to be the backward compressed data.

The integrating device 22 is used for receiving compressed data and corresponding header to pack compressed data and corresponding header as a package, and calculate a length of the package. The package is outputted to a circular buffer. The integrating device 22 receives the stop signal. When the stop signal is enabled, the integrating device 22 stops.

The address generating device 23 is used for calculating an address of the package in the circular buffer according to the length of the package. The address generating device 23 receives the stop signal. When the stop signal is enabled, the address generating device 23 stops.

In this embodiment, the corresponding header is outputted to bus 28 of a chip, and the address of the package in the circular buffer is outputted to bus 28 of the chip. The compressed data managing system 20 does not need several cycles to write the data in the header generating device 21 and the data in the address generating device 23 into the circular buffer, when the stop signal is enabled. The compressed data managing system 20 stops immediately the operation of the header generating device 21 and the address generating device 23. By connecting the header generating device 21 and the address generating device 23 to bus 28 of the chip, after the stop signal is enabled, the data in the header generating device 21 and the address generating device 23 can be read via bus 28.

Figure 3:
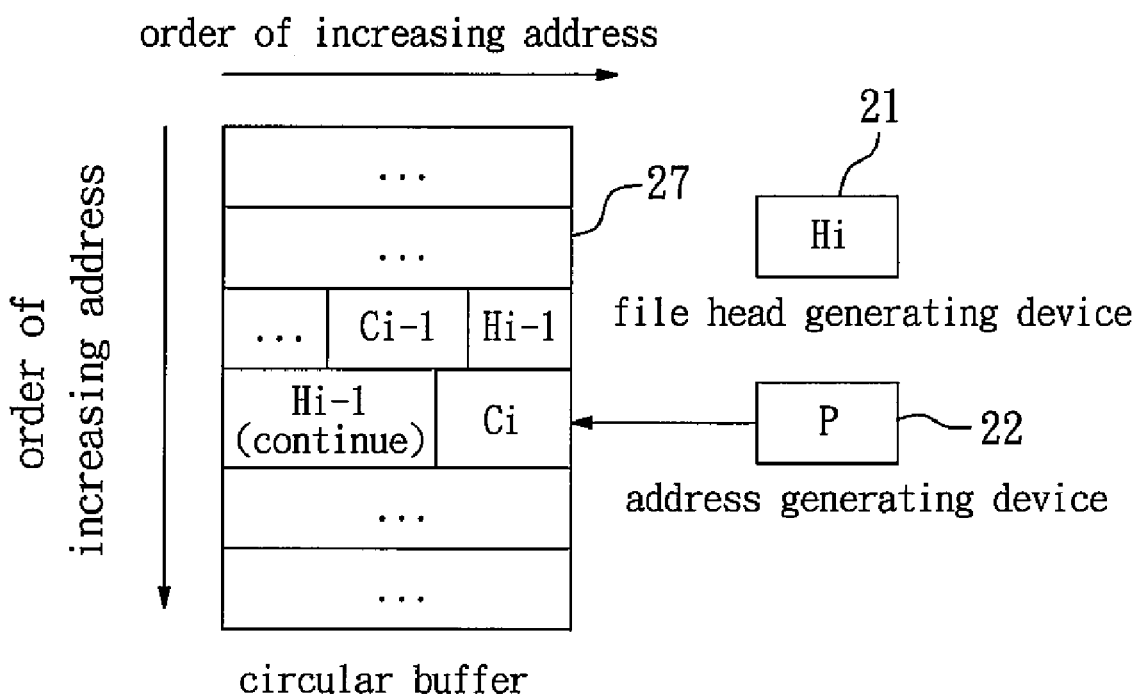
FIG. 3 is a schematic view of a circular buffer using compressed data managing system according to the present invention.

FIG. 3 shows a schematic view of a circular buffer using compressed data managing system according to the present invention. Referring to FIG. 2 and FIG. 3, they illustrate an operation embodiment of the compressed data managing system 20. The previous compressed data is $C_{i-1}$, and the previous header of the previous compressed data $C_{i-1}$ is $H_{i-1}$, they are stored into the circular buffer 27 in sequence. When the stop signal is enabled, the last compressed data is $C_i$ in the circular buffer 27, but the corresponding header $H_i$ has not been written into the circular buffer 27. The corresponding header $H_i$ is stored into the header generating device 21 and is outputted to the bus 28 of chip.

When the stop signal has enabled, during the period of the decompression, one can read the data P in the address generating device 23 via the bus 28 and use it to locate the address of the last compressed data $C_i$ in the circular buffer 27. Then, the corresponding header $H_i$ of the last compressed data $C_i$ can be read via the bus 28, so that the corresponding header $H_i$ can be used to decompress the last compressed data $C_i$. After the last compressed data $C_i$ is decompressed, the address of the previous header $H_{i-1}$ of the previous compressed data is $C_{i-1}$ in the circular buffer can be obtained. Then, the previous header $H_{i-1}$ can be used to decompress the previous compressed data $C_{i-1}$. The above steps can be repeated to decompress the data in the circular buffer 27.

Figure 4:
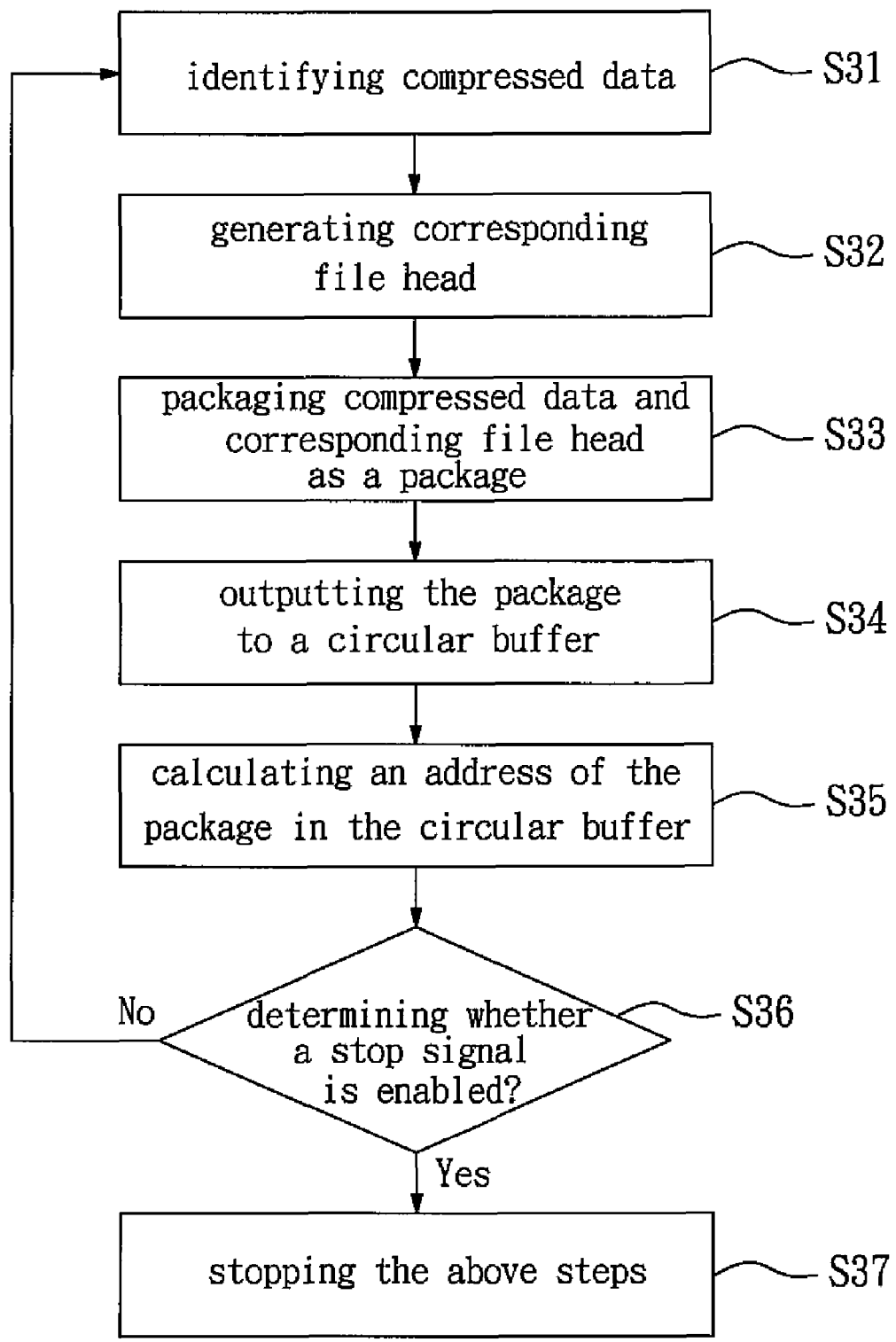
FIG. 4 illustrates a compressed data managing method for circular buffer according to the present invention.

FIG. 4 illustrates a compressed data managing method for circular buffer according to the present invention. Referring to step S31, the input compressed data is identified. Referring to step S32, corresponding header is generated according to the compressed data. In this embodiment, the corresponding header is outputted to bus of a chip. Referring to step S33, the compressed data and the corresponding header is packaged as a package according to the compressed data and the corresponding header. Step S33 further comprises a step of calculating a length of the package. Referring to step S34, the package is outputted to a circular buffer. Referring to step S35, an address of the package in the circular buffer is calculated according to the length of the package. In this embodiment, the address of the package in the circular buffer is outputted to bus of the chip. Referring to step S36, it determines whether a stop signal is enabled. Referring to step S37, if the stop signal is enabled, the above steps stop; if the stop signal is not enabled, the above steps continue and to step S31.

Given the above, after the stop signal is enabled, the data of the header generating device and the address generating device can be read via the bus. By using the system and method of the invention, when storing the compressed data in a circular buffer and an event occurs, the hardware compression mechanism can stop immediately, and the data in the circular buffer can be obtained, without jeopardizing the decompression of the compressed data. Furthermore, the problem that the tracers fail to write the last compressed data into the trace memory in the prior art can be solved.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A compressed data managing system for circular buffer, comprising:
    a header generating device, for receiving compressed data and identifying compressed data to generate corresponding header, and the header generating device for receiving a stop signal, wherein when the stop signal is enabled, the header generating device stops operation;
    an integrating device, for receiving compressed data and corresponding header to packaging compressed data and corresponding header as a package, and calculating a length of the package, wherein the package is outputted to a circular buffer, the integrating device receives the stop signal, when the stop signal is enabled, the integrating device stops operation; and
    an address generating device, for calculating an address of the package in the circular buffer according to the length of the package, and the address generating device for receiving the stop signal, wherein when the stop signal is enabled, the address generating device stops operation.

2. The compressed data managing system according to claim 1, wherein the corresponding header is outputted to bus of a chip.

3. The compressed data managing system according to claim 1, wherein the address of the package in the circular buffer is outputted to bus of a chip.

4. The compressed data managing system according to claim 1, wherein the compressed data is backward compressed data.

5. A compressed data managing method for circular buffer, comprising:
    (a) identifying compressed data and generating corresponding header;
    (b) packaging compressed data and corresponding header as a package according to compressed data and corresponding header, wherein the package is outputted to a circular buffer;
    (c) calculating an address of the package in the circular buffer; and
    (d) stopping the above steps according to a stop signal and when the stop signal is enabled;
    wherein Step (b) further comprises a step of calculating a length of the package, and in Step (c) the address of the package in the circular buffer is calculated according to the length of the package.

6. The compressed data managing method according to claim 5, wherein in Step (a), the corresponding header is outputted to bus of a chip.

7. The compressed data managing method according to claim 5, wherein in Step (c), the address of the package in the circular buffer is outputted to bus of a chip.

8. The compressed data managing method according to claim 5, wherein in Step (a), the compressed data is backward compressed data.

* * * * *